United States Patent
Huang et al.

(10) Patent No.: US 12,464,762 B2
(45) Date of Patent: Nov. 4, 2025

(54) EDMOS AND FABRICATING METHOD OF THE SAME

(71) Applicant: UNITED MICROELECTRONICS CORP., Hsin-Chu (TW)

(72) Inventors: Liang-An Huang, Tainan (TW);
Ming-Hua Tsai, Tainan (TW);
Wen-Fang Lee, Hsinchu (TW);
Chin-Chia Kuo, Tainan (TW); Jung Han, New Taipei (TW); Chun-Lin Chen, Tainan (TW); Ching-Chung Yang, Hsinchu (TW); Nien-Chung Li, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 425 days.

(21) Appl. No.: 18/108,019

(22) Filed: Feb. 10, 2023

(65) Prior Publication Data
US 2024/0234572 A1 Jul. 11, 2024

(30) Foreign Application Priority Data
Jan. 6, 2023 (TW) .................. 112100579

(51) Int. Cl.
| | |
|---|---|
| H10D 30/60 | (2025.01) |
| H10D 30/64 | (2025.01) |
| H10D 62/17 | (2025.01) |
| H10D 64/27 | (2025.01) |

(52) U.S. Cl.
CPC .......... *H10D 30/603* (2025.01); *H10D 30/64* (2025.01); *H10D 62/235* (2025.01); *H10D 64/514* (2025.01); *H10D 64/516* (2025.01)

(58) Field of Classification Search
CPC .. H10D 64/516; H10D 30/603; H10D 30/605; H10D 30/64; H10D 62/235; H10D 64/514; H10D 30/65; H10D 62/116; H10D 62/151; H10D 30/0227; H10D 64/68–693; H10D 30/0411–0415; H10D 30/69–699; H10D 84/0144; H10D 84/0181; H01L 21/28158–28238
See application file for complete search history.

(56) References Cited

U.S. PATENT DOCUMENTS

| | | | | |
|---|---|---|---|---|
| 3,719,866 A | * | 3/1973 | Naber ................... | H10D 30/69 257/326 |
| 4,566,175 A | * | 1/1986 | Smayling ............ | H01L 21/2652 257/376 |
| 5,210,597 A | * | 5/1993 | Kakiuchi ............. | H10D 30/683 257/E21.422 |

(Continued)

*Primary Examiner* — Maliheh Malek
(74) *Attorney, Agent, or Firm* — Winston Hsu

(57) ABSTRACT

An extended drain metal oxide semiconductor transistor includes a substrate. A gate is disposed on the substrate. A source doped region is disposed in the substrate at one side of the gate. A drain doped region is disposed in the substrate at another side of the gate. A thin gate dielectric layer is disposed under the gate. A thick gate dielectric layer is disposed under the gate. The thick gate dielectric layer extends from the bottom of the gate to contact the drain doped region. A second conductive type first well is disposed in the substrate and surrounds the source doped region and the drain doped region. A deep well is disposed within the substrate and surrounds the second conductive type first well.

16 Claims, 5 Drawing Sheets

(56) References Cited

U.S. PATENT DOCUMENTS

| | | | | |
|---|---|---|---|---|
| 5,314,834 A * | 5/1994 | Mazure | H10D 64/516 | 257/389 |
| 5,741,737 A * | 4/1998 | Kachelmeier | H10D 30/60 | 438/981 |
| 6,097,056 A * | 8/2000 | Hsu | H10B 41/40 | 257/315 |
| 6,121,666 A * | 9/2000 | Burr | H10D 30/0221 | 257/E29.054 |
| 6,136,674 A * | 10/2000 | An | H01L 21/2822 | 438/585 |
| 6,166,954 A * | 12/2000 | Chern | H10B 41/60 | 257/318 |
| 6,225,669 B1 * | 5/2001 | Long | H10D 64/516 | 257/547 |
| 6,586,806 B1 * | 7/2003 | Pai | H01L 21/2652 | 257/E21.409 |
| 6,620,656 B2 * | 9/2003 | Min | H10D 30/711 | 438/149 |
| 6,897,525 B1 * | 5/2005 | Kikuchi | H10D 84/013 | 257/493 |
| 6,933,557 B2 * | 8/2005 | Lojek | H10B 69/00 | 257/318 |
| 7,683,427 B2 * | 3/2010 | Chen | H10D 30/0281 | 257/E29.256 |
| 7,973,333 B2 * | 7/2011 | Dietz | H10D 30/0221 | 257/E21.414 |
| 8,026,574 B2 * | 9/2011 | Kurjanowicz | H10B 20/00 | 257/50 |
| 8,283,751 B2 * | 10/2012 | Kurjanowicz | H10B 20/00 | 257/288 |
| 8,304,835 B2 * | 11/2012 | Bulucea | H01L 21/2652 | 257/368 |
| 8,338,281 B2 * | 12/2012 | Choi | H10D 30/0281 | 438/527 |
| 8,912,600 B2 * | 12/2014 | You | H10D 62/157 | 257/E29.256 |
| 9,123,572 B2 * | 9/2015 | Kurjanowicz | G11C 17/16 | |
| 9,281,395 B2 * | 3/2016 | Lim | H10D 62/393 | |
| 9,391,030 B1 * | 7/2016 | Li | H01L 21/28158 | |
| 9,698,024 B2 * | 7/2017 | Lin | H10D 30/0285 | |
| 9,741,850 B1 * | 8/2017 | Hsiao | H10D 30/608 | |
| 10,050,115 B2 * | 8/2018 | Brown | H10D 30/65 | |
| 10,276,679 B2 * | 4/2019 | Chiu | H10D 64/01 | |
| 10,283,622 B1 * | 5/2019 | Zhang | H10D 86/01 | |
| 10,727,300 B2 * | 7/2020 | Kim | H10D 84/83 | |
| 10,784,337 B2 * | 9/2020 | Chen | H10D 64/671 | |
| 10,964,738 B2 * | 3/2021 | Chen | H04N 25/78 | |
| 11,081,357 B2 * | 8/2021 | Lee | H10D 64/691 | |
| 11,430,863 B2 * | 8/2022 | Kim | H10D 89/601 | |
| 11,495,681 B2 * | 11/2022 | Hsiung | H10D 84/0144 | |
| 11,552,194 B2 * | 1/2023 | Lee | H10D 64/516 | |
| 11,600,681 B2 * | 3/2023 | Li | H10D 30/6719 | |
| 11,888,062 B2 * | 1/2024 | Holzmüller | H10D 30/637 | |
| 12,154,972 B2 * | 11/2024 | Wang | H10D 30/0281 | |
| 12,279,453 B2 * | 4/2025 | Kim | H10D 30/0212 | |
| 12,310,083 B2 * | 5/2025 | Hsiung | H10D 30/601 | |
| 2002/0048970 A1 * | 4/2002 | Feudel | H01L 21/28211 | 257/E21.258 |
| 2002/0142529 A1 * | 10/2002 | Matsuda | H10D 30/637 | 257/E21.443 |
| 2003/0141559 A1 * | 7/2003 | Moscatelli | H10D 62/151 | 257/E21.639 |
| 2005/0112857 A1 * | 5/2005 | Gluschenkov | H10D 62/021 | 438/585 |
| 2006/0163672 A1 * | 7/2006 | Wang | H10D 84/017 | 257/E21.431 |
| 2008/0023785 A1 * | 1/2008 | Hebert | H10D 64/256 | 257/E21.336 |
| 2008/0026519 A1 * | 1/2008 | Liu | H01L 21/26506 | 257/E21.409 |
| 2008/0099833 A1 * | 5/2008 | Rouh | H10D 64/516 | 257/E29.345 |
| 2009/0166736 A1 * | 7/2009 | Park | H10D 64/516 | 118/506 |
| 2010/0237412 A1 * | 9/2010 | Shrivastava | H10D 30/0221 | 257/E29.256 |
| 2010/0244965 A1 * | 9/2010 | Shima | H10D 30/0212 | 257/E29.256 |
| 2011/0079846 A1 * | 4/2011 | Yao | H10D 30/65 | 257/E21.409 |
| 2011/0220995 A1 * | 9/2011 | Chou | H10D 30/603 | 257/E29.256 |
| 2013/0020632 A1 * | 1/2013 | Disney | H10D 30/0285 | 257/E21.409 |
| 2013/0140632 A1 * | 6/2013 | Landgraf | H10D 30/0281 | 438/286 |
| 2014/0035033 A1 * | 2/2014 | Lim | H10D 62/116 | 257/338 |
| 2014/0070315 A1 * | 3/2014 | Levy | H01L 21/02233 | 438/286 |
| 2014/0332886 A1 * | 11/2014 | Chan | H01L 21/26546 | 438/286 |
| 2015/0061011 A1 * | 3/2015 | Cheng | H10D 30/603 | 257/344 |
| 2015/0102405 A1 * | 4/2015 | Ryu | H10D 30/0281 | 438/286 |
| 2015/0249126 A1 * | 9/2015 | Kataoka | H10D 62/116 | 257/343 |
| 2016/0043193 A1 * | 2/2016 | Yu | H01L 21/266 | 257/336 |
| 2016/0181419 A1 * | 6/2016 | Ryu | H10D 62/159 | 257/343 |
| 2016/0190269 A1 * | 6/2016 | Brown | H10D 30/0221 | 438/286 |
| 2016/0268251 A1 * | 9/2016 | Hwang | H10D 30/65 | |
| 2016/0336417 A1 * | 11/2016 | Hsiao | H10D 84/0151 | |
| 2018/0261676 A1 * | 9/2018 | Sonsky | H10D 30/0213 | |
| 2018/0358349 A1 * | 12/2018 | Hwang | H10D 30/603 | |
| 2019/0019866 A1 * | 1/2019 | Kim | H10D 64/516 | |
| 2019/0288108 A1 * | 9/2019 | Shinohara | H10D 64/111 | |
| 2020/0194267 A1 * | 6/2020 | Lee | H10D 84/038 | |
| 2020/0251575 A1 * | 8/2020 | Kim | H10D 30/0227 | |
| 2020/0312666 A1 * | 10/2020 | Kim | H10D 30/603 | |
| 2021/0202708 A1 * | 7/2021 | Cheng | H10D 30/601 | |
| 2021/0272811 A1 * | 9/2021 | Ji | H01L 21/266 | |
| 2022/0052156 A1 * | 2/2022 | Kim | H10D 62/116 | |
| 2022/0085210 A1 * | 3/2022 | Hsiung | H10D 62/393 | |
| 2022/0102518 A1 * | 3/2022 | Chen | H01L 21/76224 | |
| 2022/0157972 A1 * | 5/2022 | Mehrotra | H10D 64/111 | |
| 2022/0367388 A1 * | 11/2022 | Sadovnikov | H01L 23/647 | |
| 2023/0005748 A1 * | 1/2023 | Kim | H10D 62/116 | |
| 2023/0081508 A1 * | 3/2023 | Tu | H10D 30/603 | 257/288 |
| 2023/0140347 A1 * | 5/2023 | Hsiung | H10D 30/601 | 257/344 |
| 2025/0098209 A1 * | 3/2025 | Li | H10D 64/01 | |

\* cited by examiner

EDMOS AND FABRICATING METHOD OF THE SAME

BACKGROUND OF THE INVENTION

1. Field of the Invention

The present invention relates to an extended drain metal oxide semiconductor (EDMOS) transistor and a fabricating method of the same, and more particularly to an EDMOS transistor which has a thick gate dielectric layer disposed between a gate and a drain doped region.

2. Description of the Prior Art

Common high voltage devices include vertical double-diffused MOS (VDMOS) transistors, lateral double-diffused MOS (LDMOS) transistors, and extended drain-type MOS (EDMOS) transistors. Comparing with the LDMOS transistor, the EDMOS transistor has higher on-resistance and the fabricating steps of the EDMOS transistor are fewer than that of the LDMOS transistor.

Traditionally, a drift region with a low doping concentration is provided between the drain doped region and the channel in the EDMOS transistor. This drift region is used to increase the breakdown voltage between the drain doped region and the channel. With the development of the semiconductor industry, semiconductor materials continue to improve. Therefore, the performance of EDMOS transistor needs to be increased.

SUMMARY OF THE INVENTION

In view of this, the present invention provides a novel EDMOS transistor and a fabricating method of the EDMOS transistor.

According to a preferred embodiment of the present invention, an extended drain metal oxide semiconductor (EDMOS) transistor includes a substrate. A gate is disposed on the substrate. A source doped region is disposed within the substrate at one side of the gate. A drain doped region is disposed in the substrate at another side of the gate. A thin gate dielectric layer is disposed under the gate. A thick gate dielectric layer is disposed under the gate, wherein the thick gate dielectric layer extends from a bottom of the gate to contact the drain doped region, and a thickness of the thick gate dielectric layer is greater than a thickness of the thin gate dielectric layer. A second conductive type first well is disposed in the substrate and surrounds the source doped region and the drain doped region. A deep well is disposed within the substrate and surrounds the second conductive type first well.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
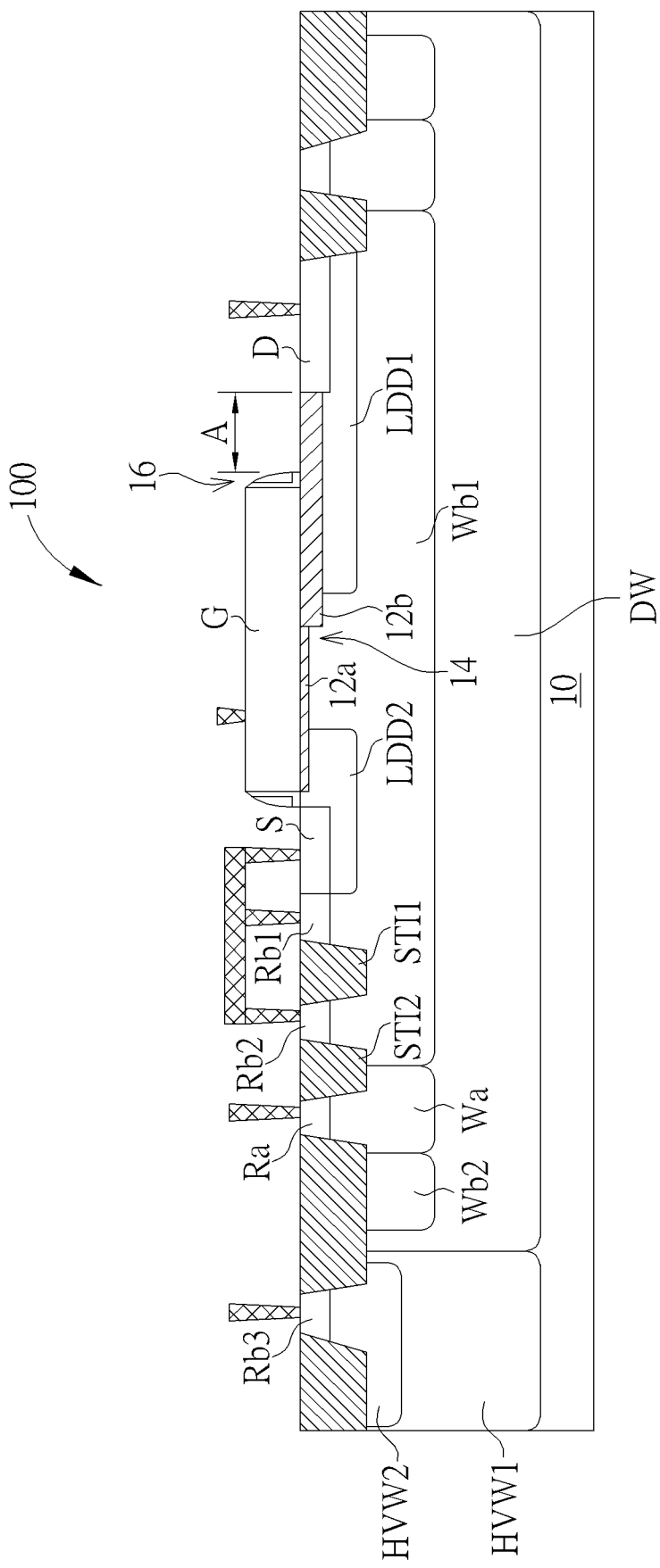
FIG. 1 depicts an extended drain metal oxide semiconductor (EDMOS) transistor according to a first preferred embodiment of the present invention.
Figure 2:
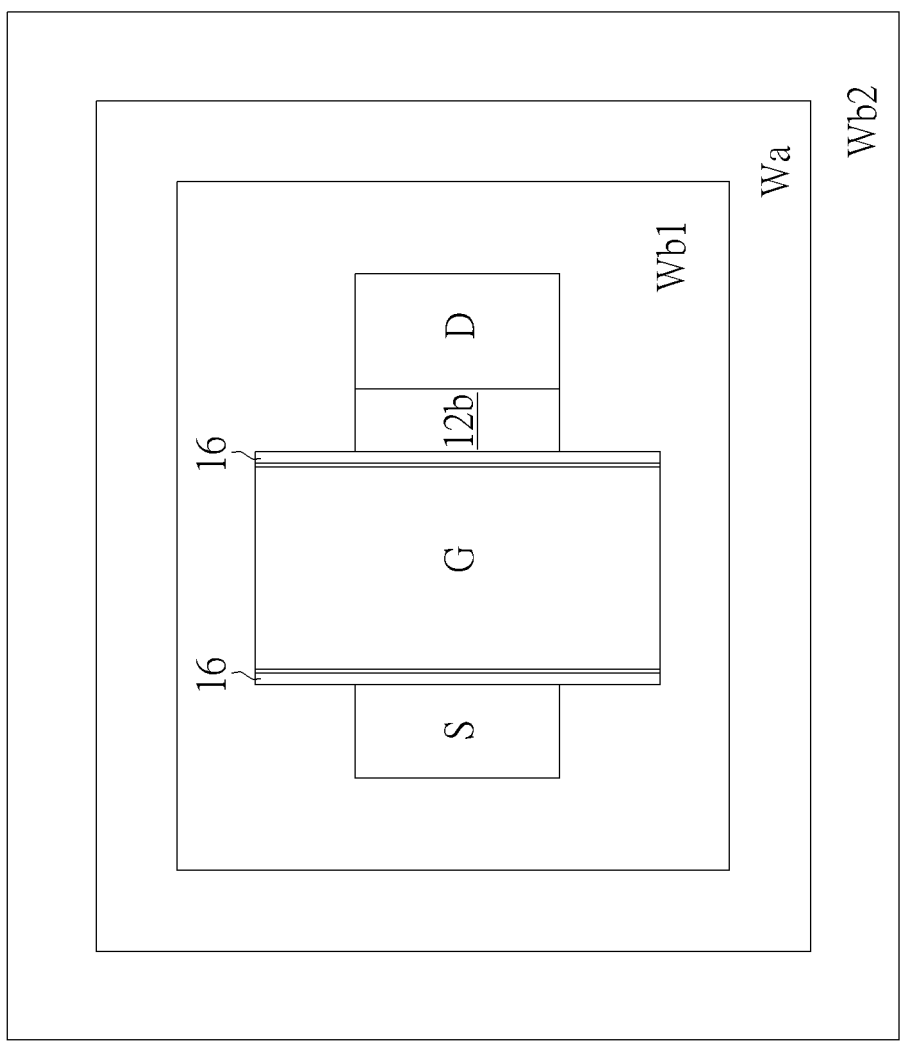
FIG. 2 depicts a top view of part of the EDMOS transistor of the first preferred embodiment.

FIG. 1 depicts an extended drain metal oxide semiconductor (EDMOS) transistor according to a first preferred embodiment of the present invention. FIG. 2 depicts a top view of part of the EDMOS transistor of the first preferred embodiment.

As shown in FIG. 1, an EDMOS transistor includes a substrate 10. The substrate 10 is a second conductive type. A gate G is disposed on the substrate 10. The gate G is preferably a metal gate. A source doped region S is disposed within the substrate 10 at one side of the gate G. A drain doped region D is disposed in the substrate 10 at another side of the gate G. A thin gate dielectric layer 12a is disposed under the gate G. A thick gate dielectric layer 12b disposed under the gate G. The thick gate dielectric layer 12b extends from a bottom of the gate G to contact the drain doped region D, and a thickness of the thick gate dielectric layer 12b is greater than a thickness of the thin gate dielectric layer 12a. The thick gate dielectric layer 12b and the thin gate dielectric layer 12a are made of silicon oxide. It is noteworthy that the thin gate dielectric layer 12a is partly embedded within the substrate 10. The thick gate dielectric layer 12b is entirely embedded within the substrate 10. The thin gate dielectric layer 12a connects to the thick gate dielectric layer 12b, and the thin gate dielectric layer 12a and the thick gate dielectric layer 12b form a step profile 14. The position of the step profile 14 is preferably under the middle of the gate G. An entirety of a top surface of the thick gate dielectric layer 12b is aligned with a top surface of the substrate 10. An entirety of a top surface of the drain doped region D is aligned with the top surface of the substrate 10.

Please also refer to FIG. 2. The EDMOS transistor 100 further includes a second conductive type first well Wb1 disposed in the substrate 10. The second conductive type first well Wb1 surrounds the source doped region S and the drain doped region D. A deep well DW is disposed within the substrate 10 and surrounds the second conductive type first well Wb1. A first conductive type well Wa surrounds the second conductive type first well Wb1. A second conductive type second well Wb2 surrounds the first conductive type well Wa. The second conductive type second well Wb2 is disposed outside of the first conductive type well Wa. The first conductive type well Wa does not overlap the second conductive type second well Wb2. In details, the second conductive type second well Wb2 is at the outermost. The second conductive type first well Wb1 is at the innermost. The first conductive type well Wa is between the second conductive type second well Wb2 and the second conductive type first well Wb1. The second conductive type second well Wb2 surrounds the first conductive type well Wa. The first conductive type well Wa surrounds the second conductive type first well Wb1.

A first conductive type first lightly doped region LDD1 is disposed under the thick gate dielectric layer 12b and under the drain doped region D. A first conductive type second lightly doped region LDD2 is disposed under the thin gate dielectric layer 12a and under the source doped region S. A second conductive type first doped region Rb1 is disposed within the second conductive type first well Wb1 and is disposed next to the source doped region S. A second conductive type second doped region Rb2 is disposed within the second conductive type first well Wb1, and at one side of the second conductive type first doped region Rb1. A first shallow trench isolation STI1 is disposed between the second conductive type first doped region Rb1 and the second conductive type second doped region Rb2 and contacts the second conductive type first doped region Rb1 and the second conductive type second doped region Rb2. A first conductive type doped region Ra is disposed within the first conductive type well region Wa. A second shallow trench isolation STI2 is disposed between the second conductive type second doped region Rb2 and the first conductive type doped region Ra. Furthermore, in this embodiment, the first conductive type second lightly doped region LDD2 does not overlap the second conductive type first doped region Rb1.

A second conductive type third doped region Rb3, a second conductive type second high voltage well HVW2 and a second conductive type first high voltage well HVW1 are disposed at one side of the deep well DW, and outside of the deep well DW. Moreover, the second conductive type third doped region Rb3, the second conductive type first high voltage well HVW1, the second conductive type second high voltage well HVW2 and the source doped region S are at the same side of the gate G. The second conductive type first high voltage well HVW1 is deeper than the second conductive type second high voltage well HVW2. The second conductive type second high voltage well HVW2 is deeper than the second conductive type third doped region Rb3.

Furthermore, a spacer structure 16 is at two sides of the gate G. The spacer structure 16 includes a single material layer or multiple material layers. In this embodiment, at least part of the thick gate dielectric layer 12b does not overlap the gate G and the spacer structure 16. The source doped region S is closer to the spacer structure 16. The drain doped region D is farther from the spacer structure 16. In details, a distance A is between the drain doped region D and the spacer structure 16. There is no salicide block between the gate G and the drain doped region D. More specifically speaking, the salicide block is not disposed on and contacts the distance A.

Furthermore, the thick gate dielectric layer 12b is not formed by fabricating processes of shallow trench isolations. Therefore, the thickness of the thick gate dielectric layer 12b is different from the thickness of the shallow trench isolations. A thickness of a device refers to a distance between the top surface of the substrate 10 and the bottom of the device. In details, the thickness of the thick gate dielectric layer 12b is smaller than the thickness of the first shallow trench isolation STI1. For example, the thickness of the thick gate dielectric layer 12b may be one-third of the thickness of the first shallow trench isolation STI1. The thickness of the drain doped region D is smaller than the thickness of the first shallow trench isolation STI1, but greater than the thick gate dielectric layer 12b. The thickness of the first conductive type first lightly doped region LDD1 is greater than the thickness of the drain doped region D.

The source doped region S, the second conductive type first doped region Rb1 and the second conductive type second doped region Rb2 are electrically connected. For example, the source doped region S, the second conductive type first doped region Rb1 and the second conductive type second doped region Rb2 can be electrically connected to each other through metal plugs and metal lines. The first conductive type doped region Ra is applied with voltage to serve as a pickup for the deep well DW. The second conductive type third doped region Rb3 is applied with voltage to serve as a pickup for the substrate 10. In this embodiment, the first conductive type is N type. The second conductive type is P type. In the different embodiment, the first conductive type can be P type. The second conductive type can be N type. Moreover, the dopant concentration of the source doped region S is greater than the dopant concentration of the first conductive type second lightly doped region LDD2. The dopant concentration of the drain doped region D is greater than the dopant concentration of the first conductive type first lightly doped region LDD1. The dopant concentration of the second conductive type first well Wb1 is greater than the dopant concentration of the deep well DW. The respective dopant concentrations of the source doped region S, the drain doped region D, the second conductive type first doped region Rb1, the second conductive type second doped region Rb2 are all greater than the dopant concentration of the deep well DW. The respective dopant concentrations of the second conductive type first doped region Rb1 and the second conductive type second doped region Rb2 are both greater than the second conductive type first well Wb1. The dopant concentration of the first conductive type doped region Ra is greater than the dopant concentration of the first conductive type well region Wa. The dopant concentration of the second conductive type third doped region Rb3 is greater than the dopant concentration of the second conductive type second high voltage well HVW2. The dopant concentration of the second conductive type second high voltage well HVW2 is greater than the dopant concentration of the second conductive type first high voltage well HVW1.

The thick gate dielectric layer 12b is arranged closer to the drain doped region D to increase the breakdown voltage of the EDMOS transistor 100. The thin gate dielectric layer 12a is arranged closer the source doped region S to make the EDMOS transistor 100 to have higher current. The EDMOS transistor 100 satisfies the requirements of at higher voltage and lower voltage by using different thicknesses for the gate dielectric layer. Moreover, the thick gate dielectric layer 12b and most of the thin gate dielectric layer 12a are embedded within the substrate 10, therefore, the top surface of the substrate 10 is almost horizontal. In this way, the gate G can be disposed on a horizontal surface, and the bottom of the gate G can be prevented from uneven. Therefore, the shape and the function of the gate G can fit the requirement. Furthermore, the thick gate dielectric layer 12b extends from the bottom of the gate G to contact the drain doped region D. In this way, the distance A between the drain doped region D and the gate G is fill up by the thick gate dielectric layer 12b. Therefore, current can start from or end at the drain doped region D. That is, the thick gate dielectric layer 12b extends the length of the channel to make the EDMOS transistor 100 sustain high voltage. In addition, although similar result can be reached by disposing the salicide block on the distance A; however, at least one fabricating step needs to be added to form the salicide block. Therefore, by using the thick gate dielectric layer 12b to fill the distance A between the gate G and the drain doped region D, the fabricating step can be decreased.

The fabricating steps of the EDMOS transistor 100 of the present invention includes forming the deep well DW and the second conductive type first high voltage well HVW1 on the substrate 10. Later, a recess (not shown) is formed within the substrate 10. This recess is for disposing the thick gate dielectric layer 12b afterwards. Next, numerous shallow trench isolations (such as the first shallow trench isolation STI1 and the second shallow trench isolation STI2), the second conductive type first well Wb1, the first conductive type well region Wa, second conductive type second well Wb2 and the second conductive type second high voltage well HVW2 are formed. Next, the first conductive type first lightly doped region LDD1, the first conductive type second lightly doped region LDD2, the drain doped region D, the source doped region S, the second conductive type first doped region Rb1, the second conductive type second doped region Rb2, the first conductive type doped region Ra, the second conductive type third doped region Rb3 are formed. After that, the thick gate dielectric layer 12b is deposited within the recess. Subsequently, the substrate 10 is oxidized to form the thin gate dielectric layer 12a. Finally, the gate G is formed. Now, the EDMOS transistor 100 is completed.

Figure 3:
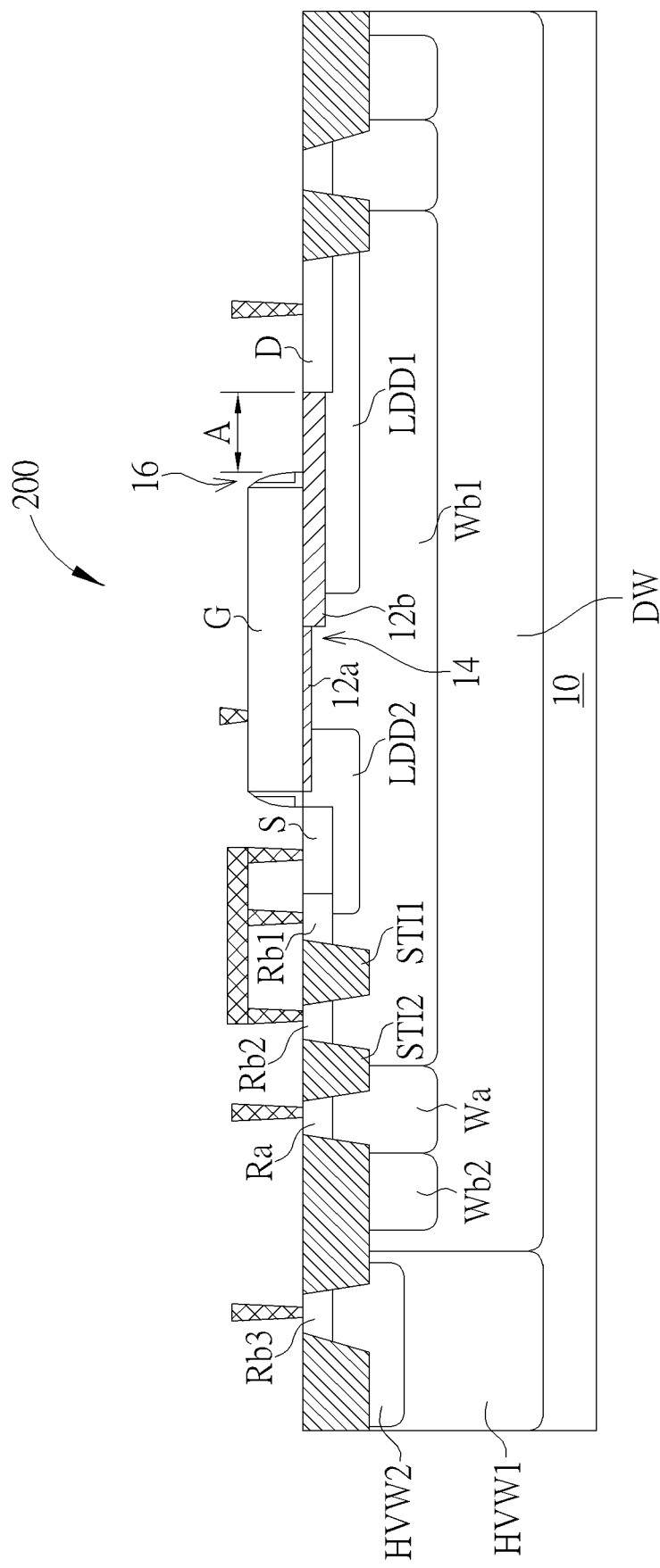
FIG. 3 depicts an EDMOS transistor according to a second preferred embodiment of the present invention.

FIG. 3 depicts an EDMOS transistor according to a second preferred embodiment of the present invention, wherein elements which are substantially the same as those in the first preferred embodiment are denoted by the same reference numerals; an accompanying explanation is therefore omitted.

The difference between the EDMOS 100 and the EDMOS 200 is that the first conductive type second lightly doped region LDD2 of the EDMOS 200 only partly overlap the second conductive type first doped region Rb1. That is, the first conductive type second lightly doped region LDD2 does not entirely overlap the second conductive type first doped region Rb1. Other elements are the same as those in the first preferred embodiment; therefore, accompanying explanations are omitted.

Figure 4:
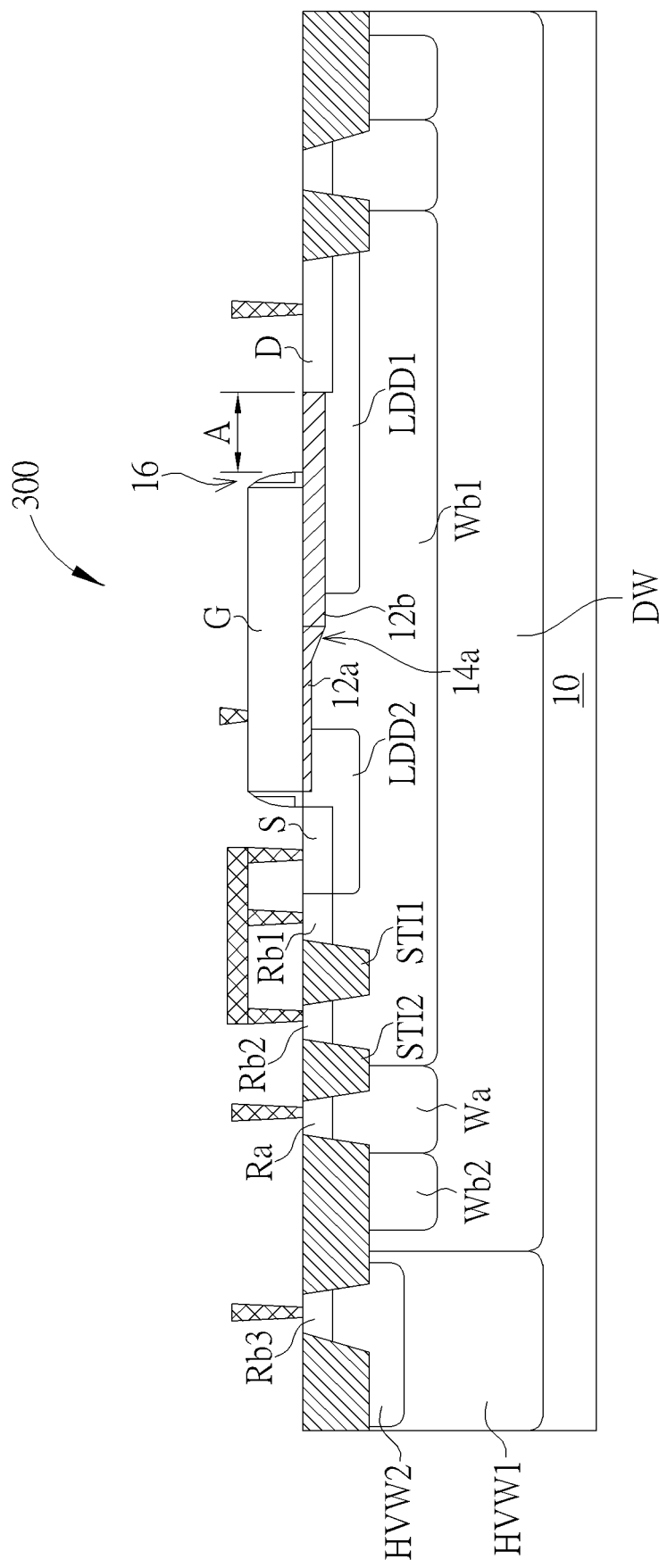
FIG. 4 depicts an EDMOS transistor according to a third preferred embodiment of the present invention.

FIG. 4 depicts an EDMOS transistor according to a third preferred embodiment of the present invention, wherein elements which are substantially the same as those in the first preferred embodiment are denoted by the same reference numerals; an accompanying explanation is therefore omitted.

As shown in FIG. 1 and FIG. 4, the difference between the EDMOS 100 and the EDMOS 300 is that in the EDMOS 300, a slope region 14a is formed between the thin gate dielectric layer 12a and the thick gate dielectric layer 12b, and the slope region 14a connects to the thin gate dielectric layer 12a and the thick gate dielectric layer 12b. Other elements are the same as those in the first preferred embodiment; therefore, accompanying explanations are omitted.

Figure 5:
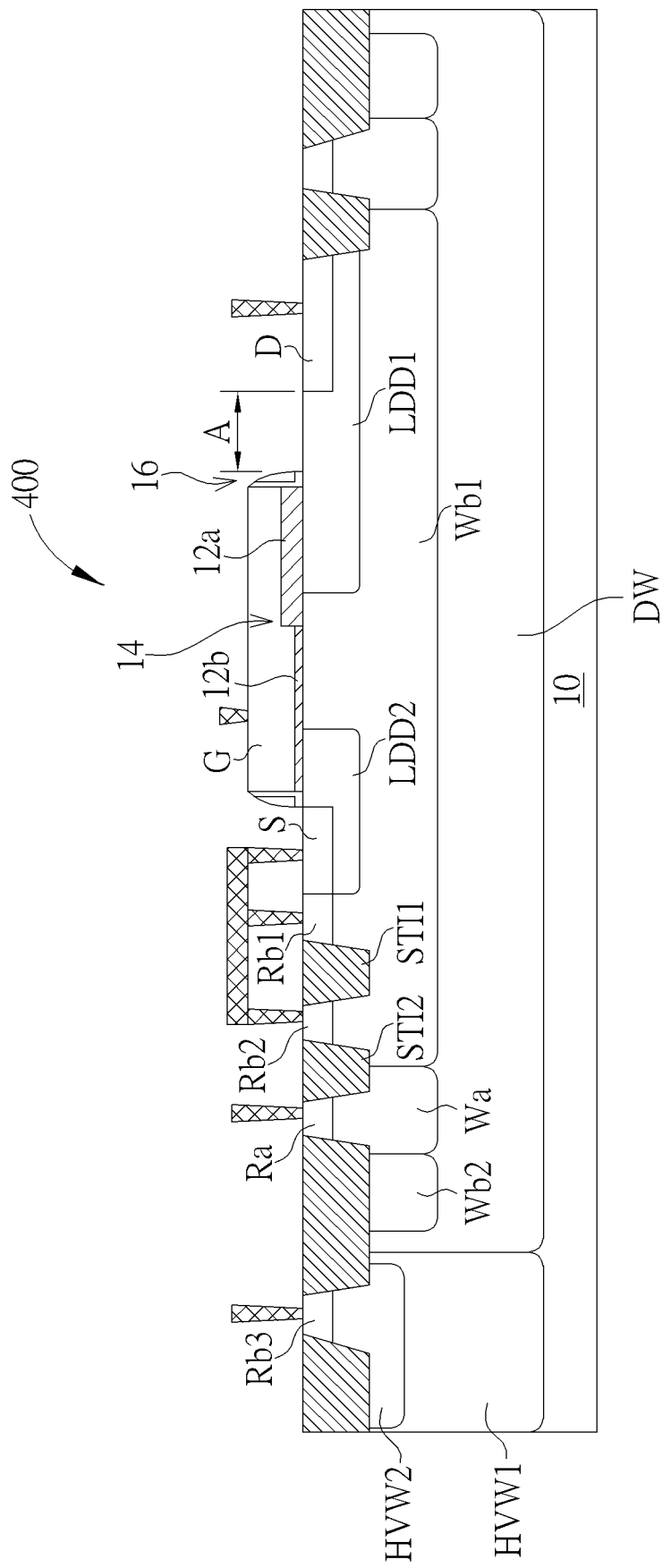
FIG. 5 depicts an EDMOS transistor according to a fourth preferred embodiment of the present invention.

FIG. 5 depicts an EDMOS transistor according to a fourth preferred embodiment of the present invention, wherein elements which are substantially the same as those in the first preferred embodiment are denoted by the same reference numerals; an accompanying explanation is therefore omitted.

As shown in FIG. 5, the thin gate dielectric layer 12a and the thick gate dielectric layer 12b are both disposed on the top surface of the substrate 10. Therefore, the step profile 14 is also formed on the top surface of the substrate 10. In this way, the bottom of the gate G becomes uneven. If the gate G is a metal gate, electrical problem will happen. Therefore, the gate G in this embodiment has to be a polysilicon gate. Other elements are the same as those in the first preferred embodiment; therefore, accompanying explanations are omitted.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An extended drain metal oxide semiconductor (EDMOS) transistor, comprising:
    a substrate;
    a gate disposed on the substrate;
    a source doped region disposed within the substrate at one side of the gate;
    a drain doped region disposed in the substrate at another side of the gate;
    a thin gate dielectric layer disposed under the gate;
    a thick gate dielectric layer disposed under the gate, wherein the thick gate dielectric layer extends from a bottom of the gate to contact the drain doped region, and a thickness of the thick gate dielectric layer is greater than a thickness of the thin gate dielectric layer;
    a second conductive type first well disposed in the substrate and surrounding the source doped region and the drain doped region;
    a deep well disposed within the substrate and surrounding the second conductive type first well;
    a first conductive type well surrounding the second conductive type first well; and
    a second conductive type second well surrounding the first conductive type well, and wherein the second conductive type second well is disposed outside of the first conductive type well.

2. The EDMOS transistor of claim 1, wherein an entirety of a top surface of the thick gate dielectric layer is aligned with a top surface of the substrate.

3. The EDMOS transistor of claim 1, wherein an entirety of a top surface of the drain doped region is aligned with a top surface of the substrate.

4. The EDMOS transistor of claim 1, wherein an entirety of the thick gate dielectric layer is embedded within the substrate.

5. The EDMOS transistor of claim 1, wherein the thin gate dielectric layer is disposed on a top surface of the substrate, and the thick gate dielectric layer is disposed on the top surface of the substrate.

6. The EDMOS transistor of claim 5, wherein the gate is a polysilicon gate.

7. The EDMOS transistor of claim 1, wherein the thin gate dielectric layer connects to the thick gate dielectric layer, and the thin gate dielectric layer and the thick gate dielectric layer form a step profile.

8. The EDMOS transistor of claim 1, further comprising:
    a first conductive type first lightly doped region disposed under the thick gate dielectric layer and under the drain doped region;
    a first conductive type second lightly doped region disposed under the thin gate dielectric layer and under the source doped region;
    a second conductive type first doped region disposed within the second conductive type first well and disposed next to the source doped region;
    a second conductive type second doped region disposed within the second conductive type first well, and at one side of the second conductive type first doped region;
    a first shallow trench isolation disposed between the second conductive type first doped region and the second conductive type second doped region and contacting the second conductive type first doped region and the second conductive type second doped region; and
    a first conductive type doped region disposed within the first conductive type well region.

9. The EDMOS transistor of claim 8, wherein the first conductive type second lightly doped region does not entirely overlap the second conductive type first doped region.

10. The EDMOS transistor of claim 9, wherein the first conductive type second lightly doped region does not overlap the second conductive type first doped region.

11. The EDMOS transistor of claim 1, further comprising a spacer structure disposed at two sides of the gate, wherein at least part of the thick gate dielectric layer does not overlap the gate and the spacer structure.

12. The EDMOS transistor of claim 1, wherein the gate is a metal gate.

13. The EDMOS transistor of claim 1, wherein there is no salicide block between the gate and the drain doped region.

14. The EDMOS transistor of claim 1, wherein the thick gate dielectric layer and the thin gate dielectric layer are made of silicon oxide.

15. The EDMOS transistor of claim 1, further comprising: a second shallow trench isolation disposed between the second conductive type second doped region and the first conductive type doped region.

16. The EDMOS transistor of claim 1, wherein the thin gate dielectric layer connects to the thick gate dielectric layer, and a slope region is formed between the thin gate dielectric layer and the thick gate dielectric layer, and the slope region connects to the thin gate dielectric layer and the thick gate dielectric layer.

* * * * *